US007307621B2

(12) United States Patent
Stivers et al.

(10) Patent No.: US 7,307,621 B2
(45) Date of Patent: Dec. 11, 2007

(54) COMPUTER SYSTEM WITH MONITOR ON/OFF FUNCTIONALITY

(75) Inventors: Daniel E. Stivers, Austin, TX (US); Timothy S. Masters, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 252 days.

(21) Appl. No.: 10/284,703

(22) Filed: Oct. 31, 2002

(65) Prior Publication Data

US 2004/0085297 A1 May 6, 2004

(51) Int. Cl.
*G09G 5/00* (2006.01)
*H03M 11/00* (2006.01)

(52) U.S. Cl. ........................ 345/172; 345/168; 341/21

(58) Field of Classification Search ........ 345/168–172, 345/211, 204; 382/114; 434/112–117; 341/21–22
See application file for complete search history.

(56) References Cited

U.S. PATENT DOCUMENTS

| | | | | | |
|---|---|---|---|---|---|
| 5,475,839 | A | * | 12/1995 | Watson et al. | 713/2 |
| 5,640,574 | A | | 6/1997 | Kawashima | 395/750 |
| 5,854,617 | A | | 12/1998 | Lee et al. | 345/102 |
| 2002/0040377 | A1 | * | 4/2002 | Newman et al. | 708/131 |
| 2003/0011972 | A1 | * | 1/2003 | Koo | 361/681 |
| 2003/0088642 | A1 | * | 5/2003 | Price et al. | 709/218 |
| 2004/0041849 | A1 | * | 3/2004 | Mock et al. | 345/867 |

* cited by examiner

*Primary Examiner*—Duc Q Dinh
(74) *Attorney, Agent, or Firm*—Baker Botts L.L.P.

(57) ABSTRACT

A portable computer system is disclosed comprising a central processing unit, a keyboard input unit coupled with the central processing unit, a display system coupled with the central processing unit, means to turn the display system on and off, wherein normal operation of the keyboard does not turn the screen on once the display is turned off.

13 Claims, 4 Drawing Sheets

COMPUTER SYSTEM WITH MONITOR ON/OFF FUNCTIONALITY

FIELD OF THE INVENTION

The present invention relates to a portable computer system, such as a laptop computer with an improved monitor/screen functionality.

BACKGROUND OF THE INVENTION

Laptop computer systems, are very helpful for disabled people and therefore often used to facilitate their life. For example, laptop computers are installed in computer labs and libraries of schools and university for the use of all students. In particular blind or visually impaired students use these computers or own their own laptop computers which they bring to the classrooms or study rooms.

Many functions of a laptop computer are not used by blind or visually impaired students and thus are not required. For example, any type of optical display and their specific functions, such as backlight functionality, are of no or little use for a blind or visually impaired user. On the other hand some functionality, for example, turning off the display while operating the laptop to preserve privacy, are not available on these type of computers.

SUMMARY OF THE INVENTION

Therefore, a need for an improved computer system and a method to operate a computer system exists which overcomes the above mentioned problems. One embodiment of the present invention is a method of operating a portable computer system comprising a central processing unit, a keyboard, and a display, wherein the method comprising the steps of:

receiving a screen control command;

determining whether a screen is activated or not;

if the screen is activated, turning the screen off wherein normal operation of the keyboard does not turn the screen on; and if the screen is not activated then turning the screen on.

Another embodiment according to the present invention is a display function software for controlling the on/off status of a display of a portable computer system comprising the steps of:

receiving a screen control command;

determining whether a screen is activated or not;

if the screen is activated, turning the screen off wherein normal operation of the keyboard does not turn the screen on; and if the screen is not activated then turning the screen on.

The screen control command can be activated by a dedicated key, by activation of a combination of keys, or a special function key can be programmed to initiate the screen control command upon activation. The screen control command can also be activated by a voice command. The method may further comprise the step of outputting a sound confirmation signal, which may be a programmable sound sequence or a synthesized voice sequence. The display function software may be integrated into a basic input/output operating system.

Another embodiment according to the present invention is a portable computer system with a central processing unit, a keyboard input unit coupled with the central processing unit, a display system coupled with the central processing unit, means to turn the display system on and off, wherein normal operation of the keyboard does not turn the screen on once the display is turned off.

The means to turn the display on and off can receive a screen command through the keyboard. A sound input system can be provided wherein the means to turn the display on and off receive a screen command through the sound input system. The system can further comprise a sound output system, wherein a sound confirmation signal is output after the display has been turned on or off. The keyboard may have a special function key for generating a signal which is sent to the means or tuning the display on and off.

Other technical advantages of the present disclosure will be readily apparent to one skilled in the art from the following figures, descriptions, and claims. Various embodiments of the present application obtain only a subset of the advantages set forth. No one advantage is critical to the embodiments.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 1:
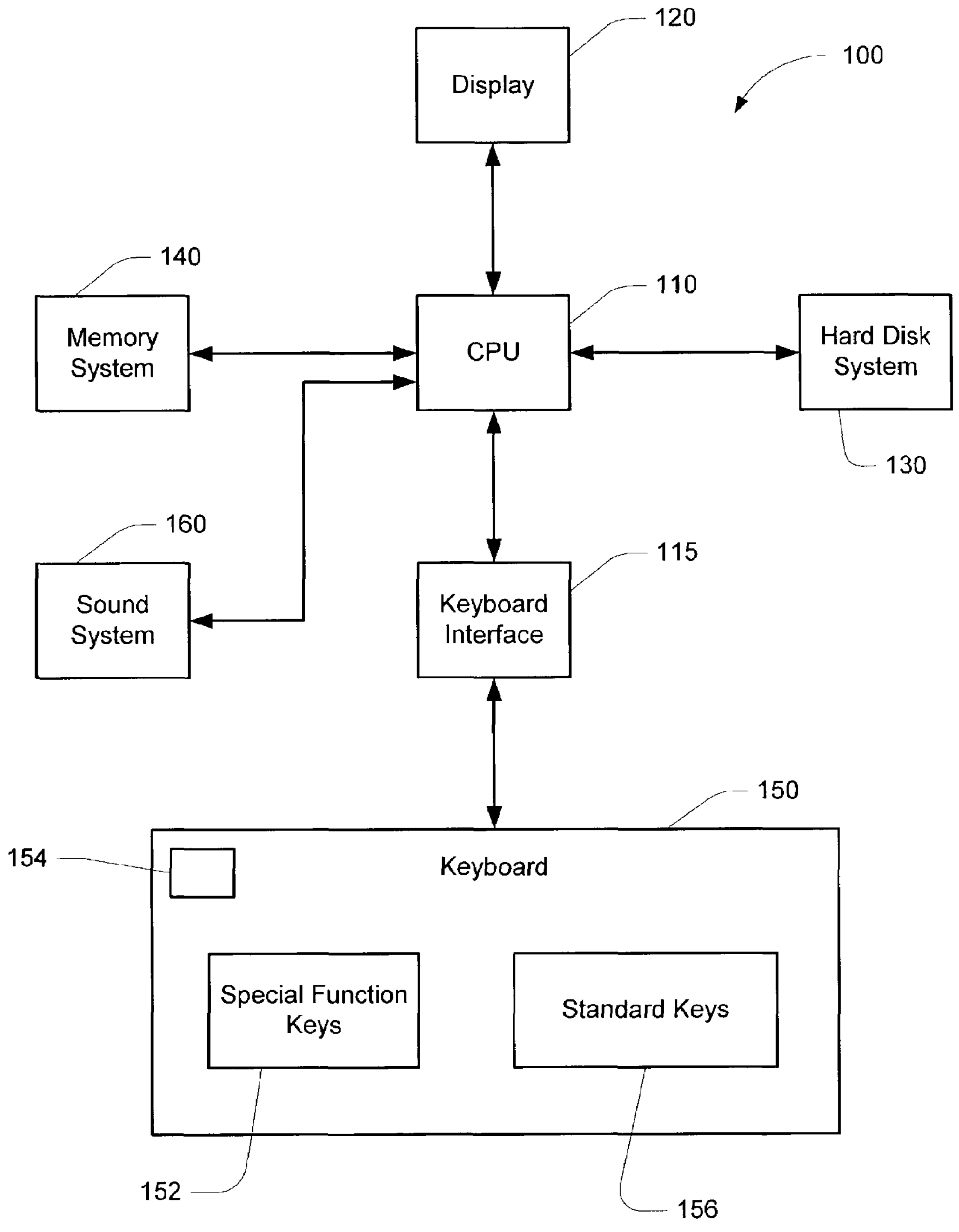
FIG. 1 is a block diagram of a personal computer system according to the present invention.

Turning to the drawings, exemplary embodiments of the present application will now be described. FIG. 1 shows a block diagram of a portable computer system 100, such as a laptop computer. The system 100 comprises a central processing unit 110 (CPU) as its central element. Connected to the CPU 110 are a keyboard 150 through a keyboard interface 115, a display 120 such as a liquid crystal display (LCD), one or more hard disks 130, a memory system 140, a sound system 160, in particular for sound output, and a plurality of peripheral units (not shown). The keyboard comprises a set of standard keys 156, a set of special function keys 152 and may additionally comprise a dedicated display on/off function key 154 according to the present invention.

During normal operation of the laptop computer system 100, all system components are powered up and are fully operational. While the backlight function can be controlled on some laptop systems, the normal screen function cannot be turned off during normal operation of the laptop computer. Usually the display is only turned off during a non-operational period to save power. However, as soon as a user operates the keyboard, the screen will be turned on again. Some laptop computers provide a special connection to an external monitor or display system. A special function key can then toggle between the external display and the internal display. However, if no external display is connected, the system will again activate the internal display if any keyboard or mouse function is activated.

The needs for a blind or visually impaired operator of a laptop computer are different. Usually, such a user uses the keyboard and mouse/trackpad as an input device and the sound system 160 as an output device by coupling it to a headset. Additional output devices such as a vibration device or other devices using tactile sensations are possible. In response to commands and respective action by the user, the system will output respective sound confirmation, synthesized voice, vibration or other tactile output signals. Therefore, the display is usually not used and requires, therefore, unnecessarily a substantial amount of energy.

According to the present invention, a keyboard system 150 of a laptop computer comprises a standard set of keys 156 and a set of special function keys 152. One of the special function keys 152 can be dedicated to turn the internal LCD display on and off independent of the operation mode of the laptop. This function mode can be either programmable assigned to this key or a combination of keys can activate this function. In this case, a normal keyboard can be used and, thus, the laptop does not need any keyboard improvement. In another embodiment a special dedicated function key 154 is present to solely control this functionality. Thus, the central processing unit 110 receives a special instruction through the keyboard interface 115 once the special function key 152, the programmed function key or the respective combination of keys is activated. Upon this activation, the central processing unit 110 executes a "turn on/off routine" in which the complete display system 120 is turned on or off depending on the present status of the display.

Figure 2:
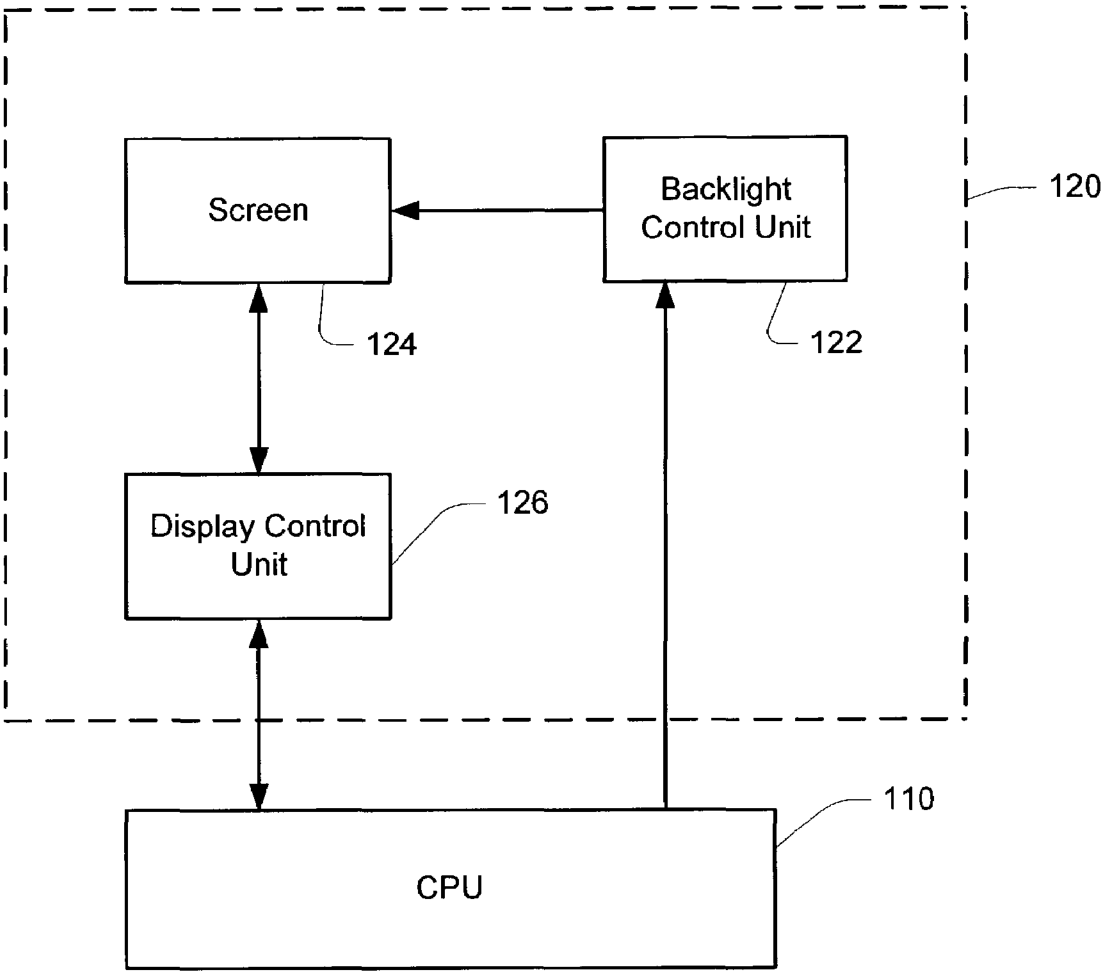
FIG. 2 is a more detailed block diagram of a display system usable in a computer system according to the present invention.

FIG. 2 shows the different elements of the display system in another more detailed block diagram. The display system 120 comprises an LCD screen 124 which is controlled and driven by a display control unit 126 coupled with the central processing unit 110. In addition, a backlight control unit 122 controls the backlight function of the screen 124 and is also coupled with the central processing unit 110. Both control units 122 and 126 comprise output drivers which can be turned on or off. Once the system receives a turn on/off command, depending on the present status, the central processing unit performs a routine which either turns on the output drivers of the display control unit 126 and the output driver of the backlight control unit 122. Thus, any command to the display control unit or the backlight control unit changing, for example, the screen content or the brightness of the backlight, will still be performed even if the drivers are turned off. Therefore, once the drivers are turned on again, the screen will show the respective current screen picture and does not have to be updated. This is in particular beneficial if a blind or visually impaired student/person wants to share information on his computer at some point with a visually not impaired student/person by showing him the content of the screen of his laptop.

Figure 3:
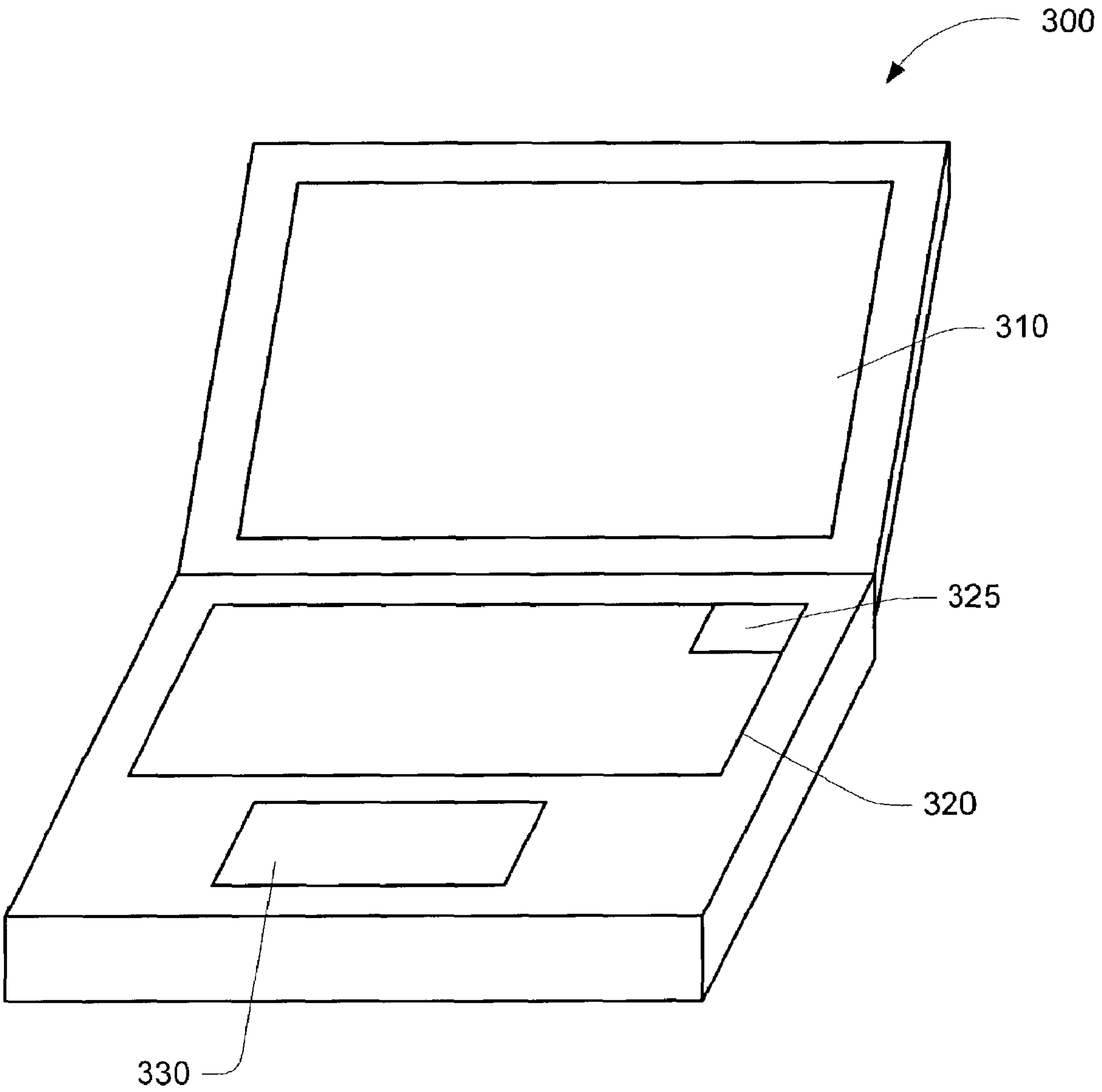
FIG. 3 is a perspective view of a laptop computer according to the present invention.

FIG. 3 shows a perspective view of a laptop computer 300. The computer is equipped with a keyboard 320, a trackpad 330 and an LCD screen 310 which can be in a closed and an opened position. When closed, the operating system will detect that status and usually shut down the computer or put it into a sleep mode in which the display is turned off. When the screen 310 is opened again, the system will re-activate the display. According to the present invention a special function key 325 is programmed or provided to initiate the screen on/off toggle function. The system will therefore also detect whether the display has been turned off before the screen is closed and thus, will not re-activate the display when the laptop operating system returns from a sleep mode. To this end, the operating system will maintain special flags within a dedicated memory area which indicate which function has been activated or de-activated.

Figure 4:
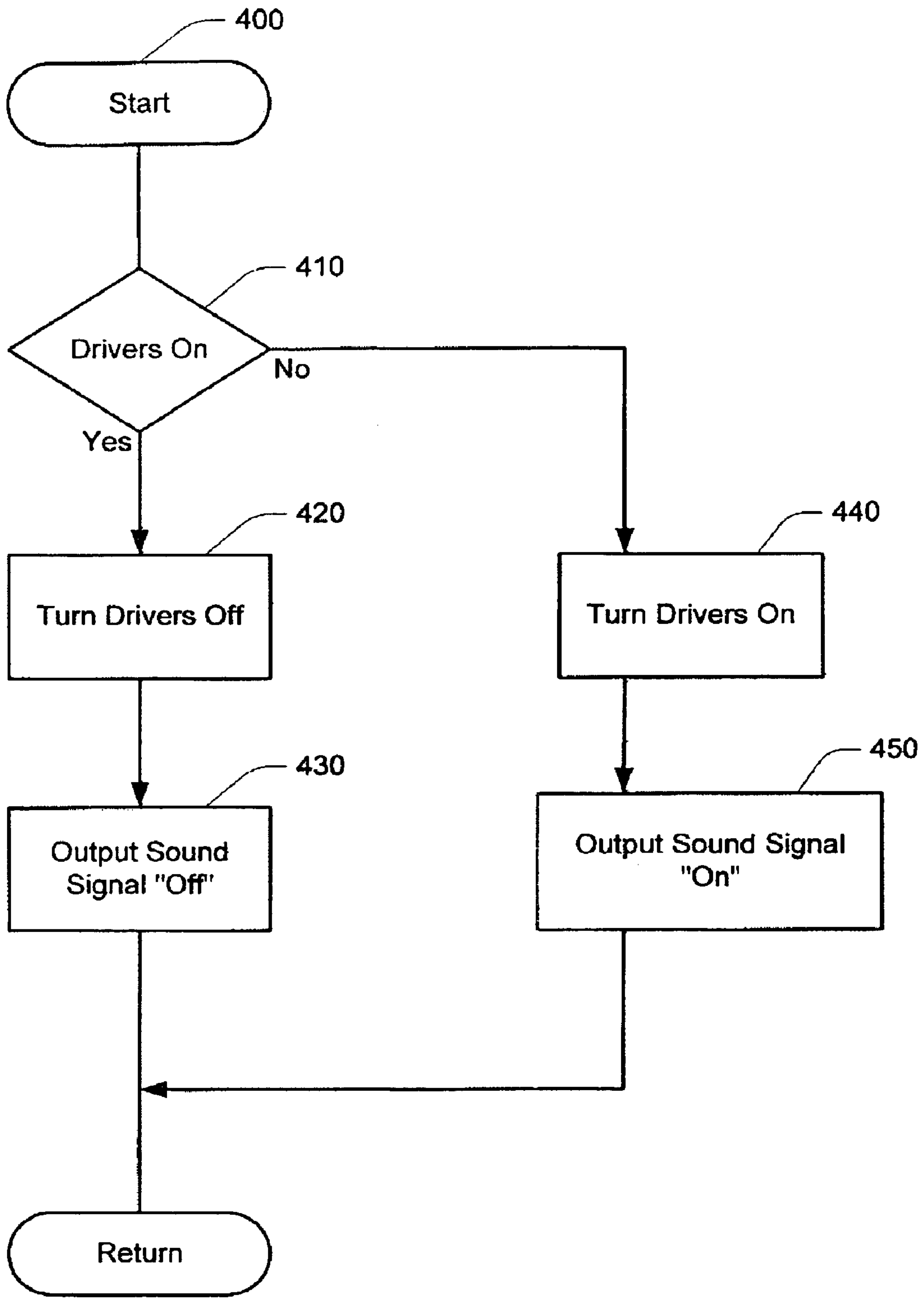
FIG. 4 is a flow chart diagram of a method according to the present invention.

FIG. 4 shows a flow chart of the screen on/off toggle routine, as for example, implemented in a display function software. In step 400, the system enters the screen on/off toggle routine after activation of the respective key as previously described. In step 410, the system checks whether the display control unit drivers have been turned off. If no, then the drivers are turned off in step 420. In step 430, the system outputs a respective sound signal indicating that the screen is now turned off. This sound signal may be a special tone or tone sequence or can be synthesized language, for example, saying "screen is now off." If the decision in step 410 was no, then the system turns the drivers on in step 440. Again, in the following step 450, the system outputs a respective sound signal through the sound system of the laptop. In either case, after the sound output, the routine returns in step 460. The routine can check the drivers for the backlight and the LCD separately or can only check the drivers for the LCD and set the drivers for the backlight function accordingly.

Thus, once the display function is turned off, the laptop computer in use will use less energy and a blind or visually impaired user who doesn't need this functionality can operate the laptop computer much longer because the LCD functionality uses a major portion of the available energy. Furthermore, as a blind or visually impaired user cannot completely control and monitor who is looking at the screen of his computer while he is operating it, a much higher level of security can be obtained.

A laptop computer equipped with this additional functionality is furthermore useful for all users in certain circumstances. For example, when the computer is used to playback audio files, usually a screen output is not required. Thus, a laptop computer which is capable of independently turning the screen on and off can save energy, for example, on an air plane, when the user is only listening to audio files. Certain functions of an audio player software assigned to certain keys of the keyboard, such as "play", "pause", "stop", "repeat" can still be used without re-activating the screen.

The screen on/off function does not necessarily be activated by a key or combination of keys. The respective control function can also be initiated by a voice command. To this end, the audio input/output system is used. A microphone, which can be externally connected or internally present receives a respective voice command which is analyzed by a respective voice recognition software which can be part of the operating system or run in parallel to other software. Once this command has been detected, the routine as previously described in conjunction with FIG. 4 is started.

The software routine for turning the display on and off can be part of any type of software run in addition to the operating system and/or other software or can be integrated into the basic input output operating system (BIOS) of the respective computer.

What is claimed is:

1. A method for operating a portable computer system comprising a central processing unit, a keyboard, and a display screen, the computer system suitable for use by a visually impaired user, the method comprising:

receiving at the central processing unit a display screen control command from the keyboard;

determining at the central processing unit whether the display control unit drivers have been turned off;

if the display control unit drivers have not been turned off, turning the power to the display control unit drivers off while maintaining the operational state of the keyboard such that the keyboard is unlocked and can transmit input commands to the central processing unit without turning the display control unit drivers on; and if the display control unit drivers have been turned off, turning the display control unit drivers on.

2. The method for operating a portable computer system of claim 1, wherein the display screen control command is activated by a dedicated key.

3. The method for operating a portable computer system of claim 1, wherein the display screen control command is activated by activation of a combination of keys.

4. The method for operating a portable computer system of claim 1, wherein a special function key can be programmed to initiate the display screen control command upon activation.

5. The method for operating a portable computer system of claim 1, wherein the display screen control command is activated by a voice command.

6. The method for operating a portable computer system of claim 1, further comprising the step of outputting a sound confirmation signal.

7. The method for operating a portable computer system of claim 6, wherein the sound confirmation signal is a programmable sound sequence.

8. The method for operating a portable computer system of claim 6, wherein the sound confirmation signal is a synthesized voice sequence.

9. A computer system suitable for use by a visually impaired user, comprising:

a processor;

memory;

a display screen;

a keyboard;

a software utility operable to receive a display screen control command from a designated key, wherein the software utility turns the power on to the display control unit drivers if the display control unit drivers are not powered, on, and wherein the software utility turns the power off to the display control unit drivers if the display control unit drivers are powered on; and wherein, during the period that the display control unit drivers are turned off, the keyboard is unlocked and the computer system is operable to receive input commands from the keyboard without turning on the display control unit drivers.

10. The computer system of claim 9, wherein the display control command is activated by a dedicated key.

11. The computer system of claim 9, wherein the display control command is activated by a combination of keys.

12. The computer system of claim 9, further comprising a control function key that is programmed to provide a display screen control command to the software utility.

13. The computer system of claim 9, wherein the display control command is a voice command.

* * * * *